(12) United States Patent
Kong et al.

(10) Patent No.: US 12,445,131 B2
(45) Date of Patent: Oct. 14, 2025

(54) BIDIRECTIONAL I/O CIRCUIT AND INTEGRATED CIRCUIT INCLUDING BIDIRECTIONAL I/O CIRCUIT

(71) Applicant: SK keyfoundry Inc., Cheongju-si (KR)

(72) Inventors: Wanchul Kong, Gwangju-si (KR); Jungho Kim, Seoul (KR)

(73) Assignee: SK keyfoundry Inc., Cheongju-si (KR)

( * ) Notice: Subject to any disclaimer, the term of this patent is extended or adjusted under 35 U.S.C. 154(b) by 86 days.

(21) Appl. No.: 18/483,611

(22) Filed: Oct. 10, 2023

(65) Prior Publication Data

US 2024/0178839 A1 May 30, 2024

(30) Foreign Application Priority Data

Nov. 29, 2022 (KR) .......................... 10-2022-0163258

(51) Int. Cl.
*H03K 19/00* (2006.01)
*H03K 17/10* (2006.01)
*H03K 19/003* (2006.01)
*H03K 19/0185* (2006.01)

(52) U.S. Cl.
CPC ..... *H03K 19/00361* (2013.01); *H03K 17/102* (2013.01); *H03K 19/018521* (2013.01)

(58) Field of Classification Search
CPC ... H03K 19/018507; H03K 19/018521; H03K 19/0016; H03K 19/018592; H03K 19/00361; H03K 17/687
See application file for complete search history.

(56) References Cited

U.S. PATENT DOCUMENTS 5,396,128 A * 3/1995 Dunning .......... H03K 19/00315
326/80
5,422,591 A * 6/1995 Rastegar ................... G05F 3/24
327/537

(Continued)

FOREIGN PATENT DOCUMENTS

| KR | 10-2010-0014730 A | 2/2010 |
| KR | 10-2018-0061862 A | 6/2018 |
| KR | 10-2020-0070603 A | 6/2020 |

OTHER PUBLICATIONS

Korean Office Action issued on Mar. 22, 2024, in counterpart Korean Patent Application No. 10-2022-0163258 (7 pages in English, 7 pages in Korean).

*Primary Examiner* — Tuan T Lam
(74) *Attorney, Agent, or Firm* — NSIP Law

(57) ABSTRACT

A bidirectional I/O circuit includes an output post driver configured to control an output signal of a bidirectional pad during a normal mode, a floating N-well network configured to apply a VDD-level bias to the output post driver based on an input signal of the bidirectional pad during a power down mode, and a post driver control circuit configured to set an input voltage level of the output post driver to a VDD level during the power down mode to prevent a leakage current path from being formed through the output post driver. A parasitic diode is formed between the drain of the first PMOS transistor and an N-well of the first PMOS transistor. The N-well of the first PMOS transistor is connected to the floating N-well network, and the source and the N-well of the first PMOS transistor are not physically connected to each other.

23 Claims, 9 Drawing Sheets

(56) References Cited

U.S. PATENT DOCUMENTS

| | | | | |
|---|---|---|---|---|
| 5,926,056 | A * | 7/1999 | Morris | H03K 19/00315 327/333 |
| 6,011,409 | A * | 1/2000 | Huang | H03K 19/00315 326/119 |
| 6,184,700 | B1 * | 2/2001 | Morris | H03K 19/00315 326/14 |
| 6,320,415 | B1 * | 11/2001 | Lee | H03K 19/00315 326/83 |
| 6,838,908 | B2 * | 1/2005 | Ker | H03K 19/00361 327/108 |
| 7,276,957 | B2 * | 10/2007 | Bhattacharya | H03K 19/00315 327/530 |
| 7,675,555 | B2 * | 3/2010 | Aridome | G11B 27/3027 375/240.26 |
| 8,957,703 | B2 * | 2/2015 | Rien | H03K 19/00315 327/333 |
| 10,985,754 | B1 * | 4/2021 | Lee | H03K 19/018592 |
| 2007/0257706 | A1 | 11/2007 | Kesselring | |

* cited by examiner

BIDIRECTIONAL I/O CIRCUIT AND INTEGRATED CIRCUIT INCLUDING BIDIRECTIONAL I/O CIRCUIT

CROSS REFERENCE TO RELATED APPLICATION

The application claims the benefit 35 U.S.C. § 119(a) of Korea Patent Application No. 10-2022-0163258, filed Nov. 29, 2022, in the Korean Intellectual Property Office, the entire disclosure of which is incorporated herein by reference for all purposes.

BACKGROUND

1. Field

The following disclosure relates to a bidirectional I/O circuit and an integrated circuit including the same.

2. Description of Related Art

In general, a plurality of chips (or integrated circuits) may be mounted on a printed circuit board. Each of the plurality of chips may include an input/output (I/O) circuit to transmit/receive data and/or control signals with other chips. For example, a signal output through an I/O circuit of a specific chip among the plurality of chips may be input to the specific chip through an I/O circuit of another chip.

Each of the plurality of chips may support a power down mode to prevent unnecessary power consumption. That is, some chips that are idle and do not perform operations among the plurality of chips may be switched to a power down mode in which supply of power to the chip is cut off. When the I/O circuit of a chip that has been switched to a power down mode is connected to the I/O circuit of a chip that operates in a normal mode, a high-level signal output from the I/O circuit of the chip that operates in the normal mode may be provided to the I/O circuit of the chip that has been switched to the power down mode. In this case, a leakage current flows to a control logic in the I/O circuit or a power node of a core logic circuit in the chip through the pad of the I/O circuit of the chip that has been switched to the power down mode. For example, the leakage current may flow to the control logic in the I/O circuit or the power node of the core logic circuit in the chip by passing through a PMOS parasitic diode of an ESD (Electrostatic Discharge) protection device or a PMOS parasitic diode of an output driver through the pad of the I/O circuit. Since the input of the control logic or core logic circuit may be in a floating state, a leakage current continuously flows from the power node to a ground node, resulting in considerable power consumption.

As described above, when a high-level signal is applied to an I/O circuit of a chip that has been switched to a power-down mode, considerable power is consumed. Conventionally, a method of performing design in advance such that a low-level signal is provided to the I/O circuit of a chip operating in a power-down mode has been proposed, but the method may limit design flexibility and may disadvantageously affect potential performance or design of a product under development.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, a bidirectional I/O circuit includes a bidirectional pad configured to receive and transmit signals, an output post driver configured to control an output signal of the bidirectional pad during a normal mode, a floating N-well network configured to apply a VDD-level bias to the output post driver based on an input signal of the bidirectional pad during a power down mode, and a post driver control circuit configured to set an input voltage level of the output post driver to a VDD level during the power down mode to prevent a leakage current path from being formed through the output post driver. The output post driver includes a first PMOS transistor having a source connected to VDD, a drain connected to the bidirectional pad, and a gate connected to the post driver control circuit. A parasitic diode is formed between the drain of the first PMOS transistor and an N-well of the first PMOS transistor. The N-well of the first PMOS transistor is connected to the floating N-well network, and the source and the N-well of the first PMOS transistor are not physically connected to each other.

The post driver control circuit may include either one or both of an input voltage setting unit configured to set an input voltage level of the first PMOS transistor to the VDD level based on a VDD-level signal input through the bidirectional pad during the power down mode, and a leakage preventing unit configured to block connections between the gate of the first PMOS transistor and a first control signal input terminal during the power down mode. The first control signal input terminal may be configured to provide a signal for controlling the first PMOS transistor on/off during the normal mode.

The input voltage setting unit may include a second PMOS transistor and a third PMOS transistor each having a floating N-well structure. A source of the second PMOS transistor may be connected to the gate of the first PMOS transistor, a drain of the second PMOS transistor may be connected to a source of the third PMOS transistor, a gate of the second PMOS transistor may be connected to the VDD, and an N-well of the second PMOS transistor may be connected to the floating N-well network. A drain of the third PMOS transistor may be connected to the leakage preventing unit, a gate of the third PMOS transistor may be connected to the VDD, and an N-well of the third PMOS transistor may be connected to the floating N-well network. A node between the drain of the second PMOS transistor and the source of the third PMOS transistor may be connected to an input side of the bidirectional pad.

The leakage preventing unit may include a transmission gate connecting the first control signal input terminal and the gate of the first PMOS transistor. The transmission gate may include a second NMOS transistor and a fourth PMOS transistor connected in parallel. A gate of the second NMOS transistor may be connected to the VDD, and a gate of the fourth PMOS transistor may be connected to the drain of the third PMOS transistor.

An N-well of the fourth PMOS transistor may be connected to the floating N-well network.

The leakage preventing unit may further include a third NMOS transistor configured to sink current flowing into the VDD to the ground during the power down mode. A drain of the third NMOS transistor may be connected to the VDD, a source of the third NMOS transistor may be connected to the ground, and a gate of the third NMOS transistor may be connected to a node between the gate of the fourth PMOS transistor and the drain of the third PMOS transistor.

The post driver control circuit may further include an output control unit configured to control an output of the output post driver according to an input/output mode during the normal mode and adjust timing of current flowing through the output post driver during the normal mode.

The output control unit may include a fourth NMOS transistor and a fifth NMOS transistor. A drain of the fourth NMOS transistor may be connected to a node between the gate of the fourth PMOS transistor and the drain of the third PMOS transistor, a source of the fourth NMOS transistor may be connected to a drain of the fifth NMOS transistor, and a gate of the fourth NMOS transistor may be connected to the VDD. A source of the fifth NMOS transistor may be connected to the ground, and a gate of the fifth NMOS transistor may be configured to receive an output enable negative (OEN) signal enabling an output mode. The fourth NMOS transistor may be configured to prevent a signal input through the bidirectional pad from flowing to the ground of the fifth NMOS transistor during the power-down mode.

The output control unit may further include a NOR gate and a sixth NMOS transistor. The NOR gate may be configured to perform a NOR operation on the output enable negative (OEN) signal and a drive (DRV) signal for selecting a drive current. A drain of the sixth NMOS transistor may be connected to a node between the fourth NMOS transistor and the fifth NMOS transistor, a source of the sixth NMOS transistor may be connected to the ground, and a gate of the sixth NMOS transistor may be configured to receive a result of the NOR operation of the NOR gate.

The output post driver may further include a first NMOS transistor and a seventh NMOS transistor. A drain of the first NMOS transistor may be connected to a source of the seventh NMOS transistor, a source of the first NMOS transistor may be connected to the ground, and a gate of the first NMOS transistor may be connected to a second control signal input terminal. A drain of the seventh NMOS transistor may be connected to a node between the first PMOS transistor and the bidirectional pad, a source of the seventh NMOS transistor may be connected to the drain of the first NMOS transistor, and a gate of the seventh NMOS transistor may be connected to the VDD. The seventh NMOS transistor may be configured to prevent a signal input through the bidirectional pad from flowing to the ground of the first NMOS transistor during the power-down mode.

The floating N-well network may include two PMOS transistors serially disposed on an input side of the bidirectional pad. A first PMOS transistor of the two PMOS transistors may include a source connected to the VDD, a drain connected to a source of a second PMOS transistor of the two PMOS transistors, and a gate connected to the input side of the bidirectional pad. The second PMOS transistor may include the source connected to the drain of the first PMOS transistor, a drain connected to the input side of the bidirectional pad, and a gate connected to the VDD. A parasitic diode may be formed between the drain of the second PMOS transistor and an N-well of the second PMOS transistor. An N-well of the first PMOS transistor and the N-well of the second PMOS transistor may be connected to each other, and a node between the N-well of the first PMOS transistor and the N-well of the second PMOS transistor may be connected to a node between the drain of the first PMOS transistor and the source of the second PMOS transistor to form a floating N-well node regardless of signal input to the bidirectional pad during the power down mode.

The bidirectional I/O circuit may further include an ESD protection circuit disposed on an input side of the bidirectional pad to protect a component included in the bidirectional I/O circuit. The ESD protection circuit may include a PMOS transistor having a source connected to the VDD, a drain connected to the input side of the bidirectional pad, and a gate connected to the floating N-well network. A parasitic diode may be formed between the drain and N-well of the PMOS transistor. The N-well of the PMOS transistor may be connected to the floating N-well network, and the source and the N-well of the PMOS transistor may not be physically connected to each other.

In another one or more general aspects, an integrated circuit includes a core logic circuit, and a bidirectional I/O circuit connected to the core logic circuit. The bidirectional I/O circuit includes a bidirectional pad configured to receive and transmit signals, an output post driver configured to control an output signal of the bidirectional pad during a normal mode, a floating N-well network configured to apply a VDD-level bias to the output post driver based on an input signal of the bidirectional pad during a power down mode, and a post driver control circuit configured to set an input voltage level of the output post driver to a VDD level during the power down mode to prevent a leakage current path from being formed through the output post driver. The output post driver includes a first PMOS transistor having a source connected to VDD, a drain connected to the bidirectional pad, and a gate connected to the post driver control circuit. A parasitic diode is formed between the drain of the first PMOS transistor and an N-well of the first PMOS transistor. The N-well of the first PMOS transistor is connected to the floating N-well network, and the source and the N-well of the first PMOS transistor are not physically connected to each other.

The post driver control circuit may include either one or both of an input voltage setting unit configured to set an input voltage level of the first PMOS transistor to the VDD level based on a VDD-level signal input through the bidirectional pad during the power down mode, and a leakage preventing unit configured to block connections between the gate of the first PMOS transistor and a first control signal input terminal during the power down mode. The first control signal input terminal may be configured to provide a signal for controlling the first PMOS transistor on/off during the normal mode.

The input voltage setting unit may include a second PMOS transistor and a third PMOS transistor each having a floating N-well structure. A source of the second PMOS transistor may be connected to the gate of the first PMOS transistor, a drain of the second PMOS transistor may be connected to the source of the third PMOS transistor, a gate of the second PMOS transistor may be connected to the VDD, and an N-well of the second PMOS transistor may be connected to the floating N-well network. A source of the third PMOS transistor may be connected to the drain of the second PMOS transistor, a drain of the third PMOS transistor may be connected to the leakage preventing unit, a gate of the third PMOS transistor may be connected to the VDD, and an N-well of the third PMOS transistor may be connected to the floating N-well network. A node between the drain of the second PMOS transistor and the source of the third PMOS transistor may be connected to an input side of the bidirectional pad.

The leakage preventing unit may include a transmission gate connecting the first control signal input terminal and the gate of the first PMOS transistor. The transmission gate may include a second NMOS transistor and a fourth PMOS transistor connected in parallel. A gate of the second NMOS transistor may be connected to the VDD, and a gate of the fourth PMOS transistor may be connected to the drain of the third PMOS transistor.

An N-well of the fourth PMOS transistor may be connected to the floating N-well network.

The leakage preventing unit may further include a third NMOS transistor configured to sink current flowing into the VDD to the ground during the power down mode. A drain of the third NMOS transistor may be connected to the VDD, a source of the third NMOS transistor may be connected to the ground, and a gate of the third NMOS transistor may be connected to a node between the gate of the fourth PMOS transistor and the drain of the third PMOS transistor.

The post driver control circuit may include an output control unit configured to control an output of the output post driver according to an input/output mode during the normal mode and adjust timing of current flowing through the output post driver during the normal mode.

The output control unit may include a fourth NMOS transistor and a fifth NMOS transistor. A drain of the fourth NMOS transistor may be connected to a node between the gate of the fourth PMOS transistor and the drain of the third PMOS transistor, a source of the fourth NMOS transistor may be connected to the drain of a fifth NMOS transistor, and a gate of the fourth NMOS transistor may be connected to the VDD. A source of the fifth NMOS transistor may be connected to the ground, and a gate the fifth NMOS transistor may be configured to receive an output enable negative (OEN) signal enabling an output mode. The fourth NMOS transistor may be configured to prevent a signal input through the bidirectional pad from flowing to the ground of the fifth NMOS transistor during the power-down mode.

The output control unit may further include a NOR gate and a sixth NMOS transistor. The NOR gate may be configured to perform a NOR operation on the output enable negative (OEN) signal and a drive (DRV) signal for selecting a drive current. A drain of the sixth NMOS transistor may be connected to a node between the fourth NMOS transistor and the fifth NMOS transistor, a source of the sixth NMOS transistor may be connected to the ground, and a gate of the sixth NMOS transistor may be configured to receive a result of the NOR operation of the NOR gate.

The output post driver may further include a first NMOS transistor and a seventh NMOS transistor. A drain of the first NMOS transistor may be connected to a source of the seventh NMOS transistor, a source of the first NMOS transistor may be connected to the ground, and a gate of the first NMOS transistor may be connected to a second control signal input terminal. A drain of the seventh NMOS transistor may be connected to a node between the first PMOS transistor and the bidirectional pad, a source of the seventh NMOS transistor may be connected to the drain of the first NMOS transistor, and a gate of the seventh NMOS transistor may be connected to the VDD. The seventh NMOS transistor may be configured to prevent a signal input through the bidirectional pad from flowing to the ground of the first NMOS transistor during the power-down mode.

The floating N-well network may include two PMOS transistors serially disposed on an input side of the bidirectional pad. A first PMOS transistor of the two PMOS transistors may include a source connected to the VDD, a drain connected to a source of a second PMOS transistor of the two PMOS transistors, and a gate connected to the input side of the bidirectional pad. The second PMOS transistor may include the source connected to the drain of the first PMOS transistor, a drain connected to the input side of the bidirectional pad, and a gate connected to the VDD. A parasitic diode may be formed between the drain of the second PMOS transistor and an N-well of the second PMOS transistor. An N-well of the first PMOS transistor and the N-well of the second PMOS transistor may be connected to each other, and a node between the N-well of the first PMOS transistor and the N-well of the second PMOS transistor may be connected to a node between the drain of the first PMOS transistor and the source of the second PMOS transistor to form a floating N-well node regardless of signal input to the bidirectional pad during the power down mode.

The bidirectional I/O circuit may further include an ESD protection circuit disposed on an input side of the bidirectional pad to protect a component included in the bidirectional I/O circuit. The ESD protection circuit may include a PMOS transistor (PEO) having a source connected to the VDD, a drain connected to the input side of the bidirectional pad, and a gate connected to the floating N-well network. A parasitic diode may be formed between the drain and N-well of the PMOS transistor (PEO). The N-well of the PMOS transistor (PEO) may be connected to the floating N-well network, and the source and the N-well of the PMOS transistor (PEO) are not physically connected to each other.

Other features and aspects will be apparent from the following detailed description, the drawings, and the claims.

Figure 1:
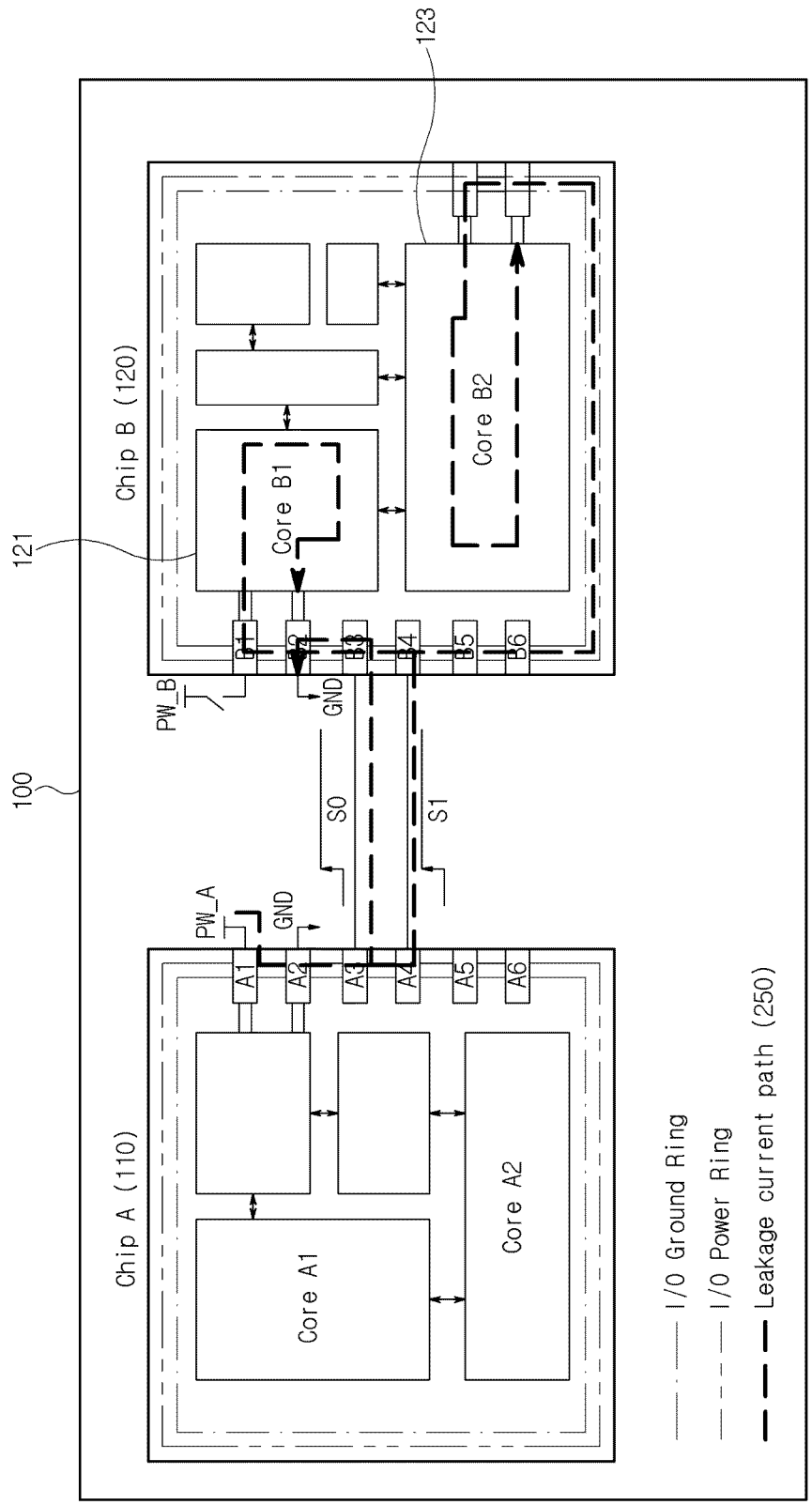
FIG. 1 is a diagram illustrating an example of a leakage current path of an integrated circuit operating in a power down mode.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first", "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present disclosure may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. A record medium is coupled to a processor and the processor can read information from the record medium and can record the information in a storage medium. In another way, the record medium may be integrally formed with the processor. The processor and the record medium may be resident within an application specific integrated circuit (ASIC).

Figure 2:
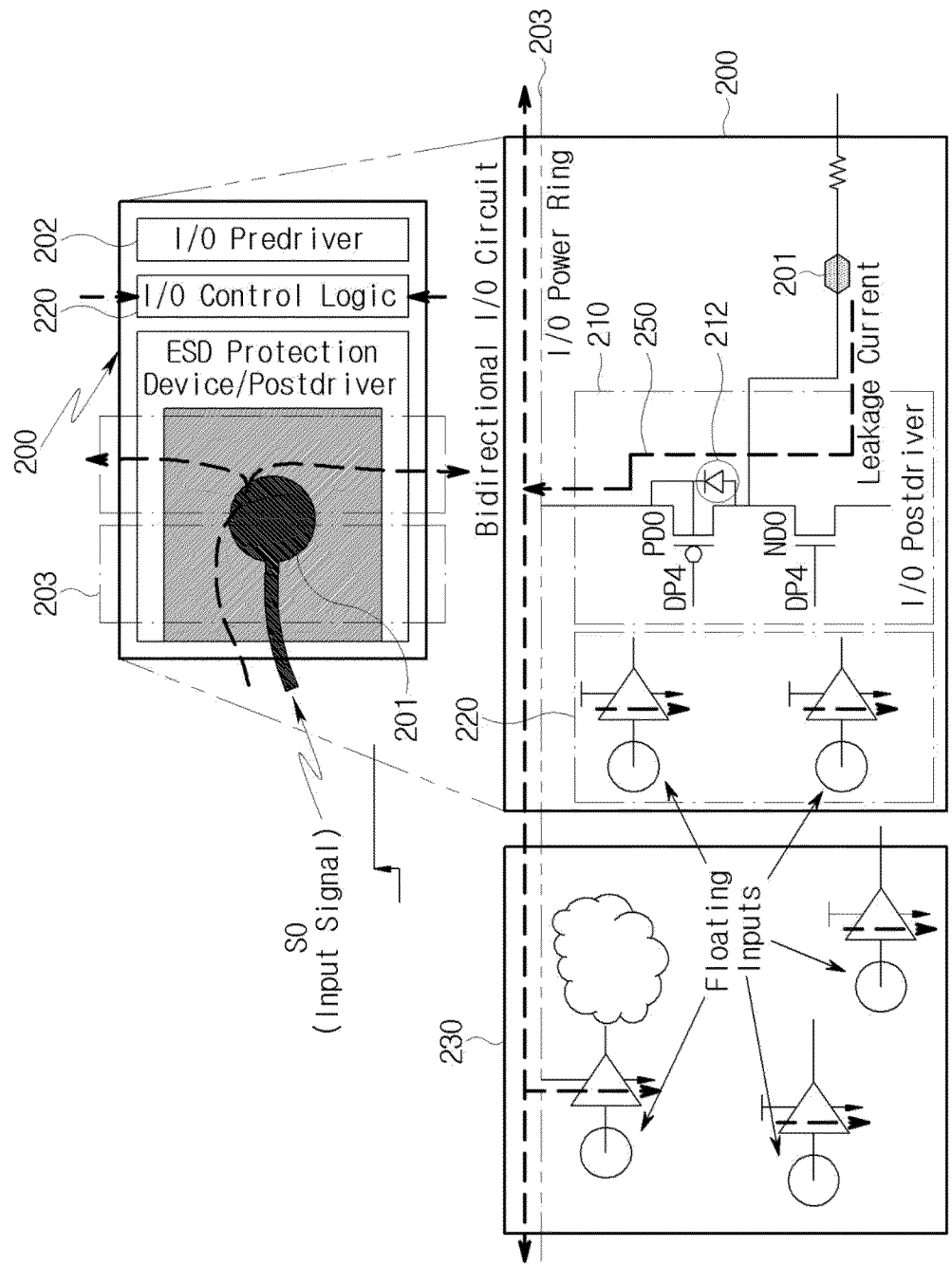
FIG. 2 is a diagram illustrating an example a path of a leakage current flowing through an output post driver included in an I/O circuit of an integrated circuit operating in a power down mode.

FIG. 1 is a diagram illustrating an example of a leakage current path of an integrated circuit operating in a power down mode, and FIG. 2 is a diagram illustrating an example a path of a leakage current flowing through an output post driver included in an I/O circuit of an integrated circuit operating in a power down mode. Here, some components (e.g., an I/O ground ring and an I/O power ring) are shown in dotted lines, but this is only for distinction from other components and does not imply that the component is in a physically discrete state. That is, although the I/O ground ring and the I/O power ring are shown as dotted lines, they may be physically connected continuously.

First, referring to FIG. 1, a printed circuit board 100 may include a chip A (Chip A) 100 and a chip B (Chip B) 120 mounted thereon. A chip may refer to an integrated circuit. Each of the chip A 110 and the chip B 120 may include a plurality of input/output (I/O) circuits A1-A6 and B1-B6 for transmitting and receiving data and/or control signals. The plurality of I/O circuits A1-A6 and B1-B6 may include at least one bidirectional I/O circuit. For example, B3 and B4 may be bidirectional I/O circuits.

According to one embodiment, when the chip A 110 is operating in a normal mode, the chip B 120 may be switched to a power down mode. In this case, power PW_A to the chip A 110 may be continuously supplied, and the supply of power PW_B to the chip B 120 may be cut off.

When the chip A 110 operates in a normal mode and the chip B 120 operates in a power down mode, output signals at the VDD-level, for example, S0 and S1 at a high level may be output from the I/O circuits A3 and A4 of the chip A 110. In this case, the output signals S0 and S1 of the chip A 110 are applied to the bidirectional I/O circuits B3 and B4 of the chip B 120 and then introduced to the control logics of bidirectional I/O circuits B3 and B4 and/or the core logic circuits (Core B1 and Core B2) 121 and 123 of the logic chip B 120. That is, when the VDD-level signals are input from the chip A 110 to the bidirectional I/O circuits B3 and B4 of the chip B 120 in a state where the supply of power to the interior of the chip B 120 is cut off, a leakage current path to a power node may be formed through PMOS parasitic diodes included in the bidirectional I/O circuits B3 and B4.

The bidirectional I/O circuits B3 and/or B4 may be designed to process both input and output signals through bidirectional pads. For example, as shown in FIG. 2, the bidirectional I/O circuit 200 may include an output post driver 210 provided on at output end thereof to process an output signal to be output through the bidirectional pad 201. Before the output post driver 210 transfers an output signal to an external chip (e.g., chip A 110) through the bidirectional pad 201, the output post driver 210 may adjust a voltage amplitude of the output signal or adjust the rise and/or fall time of the output signal in consideration of a signal loss caused by the RC of the output node or a signal slope. The output post driver 210 may have an inverter type buffer structure including a PMOS transistor PD0 and an NMOS transistor ND0. In this case, since a parasitic diode 212 is formed between the N-well node and the drain of the PMOS transistor PD0, a leakage current path 250 running from the bidirectional pad 201 to an I/O power ring 203 via the parasitic diode 212 of the PMOS transistor PD0 may be formed. The I/O power ring 203 may include power nodes connected to the power source PW_B of the chip B 120 to supply power to components in the chip B 120. Therefore, a VDD-level signal input through the bidirectional pad 201 may be introduced into an I/O control logic 220 in the I/O circuit 200 and the core logic circuit 230 in the chip B 120 via the leakage current path running to the I/O power ring 203. In this case, since the chip B 120 is switched to the power down mode, input signals of the I/O control logic 220 and the core logic circuit 230 in the chip B 120 may be in a floating state (or unknown state) in which the voltage level thereof cannot be specified. Accordingly, a leakage current may continuously flow from the I/O control logic 220 and the power node of the core logic circuit 230 in the chip B 120 to the ground node through the leakage current path.

Therefore, in one or more embodiments of the present disclosure, a structure of a bidirectional I/O circuit that blocks a leakage current path as described above and an integrated circuit including the same will be disclosed. One or more embodiments of the present disclosure will propose a bidirectional I/O circuit structure that blocks the leakage current path during a power down mode using a floating N-well network and a control circuit.

Prior to describing the bidirectional I/O circuit structure to be proposed, referring to FIG. 2, the N-well node of the PMOS transistor PD0 is connected to the source of the PMOS transistor PD0 and then connected to the power node at the VDD level, so that a parasitic diode 212 may be formed between the drain and the N-well node of the PMOS transistor PD0. Accordingly, it can be seen that, when a forward bias condition is satisfied, a leakage current is able to flow to the power node through the N-well node connected to the parasitic diode.

Accordingly, in one or more embodiments of the present disclosure, the leakage current path is blocked by physically cutting connection between the N-well node and the power node. In this case, since the N-well node and the power node are not physically connected, a bias at the VDD level may be applied to the N-well node using the floating N-well network structure for normal operation of a chip including a bidirectional I/O circuit. The floating N-well network structure will be described below with reference to FIGS. 3A and 3B.

Figure 3A:
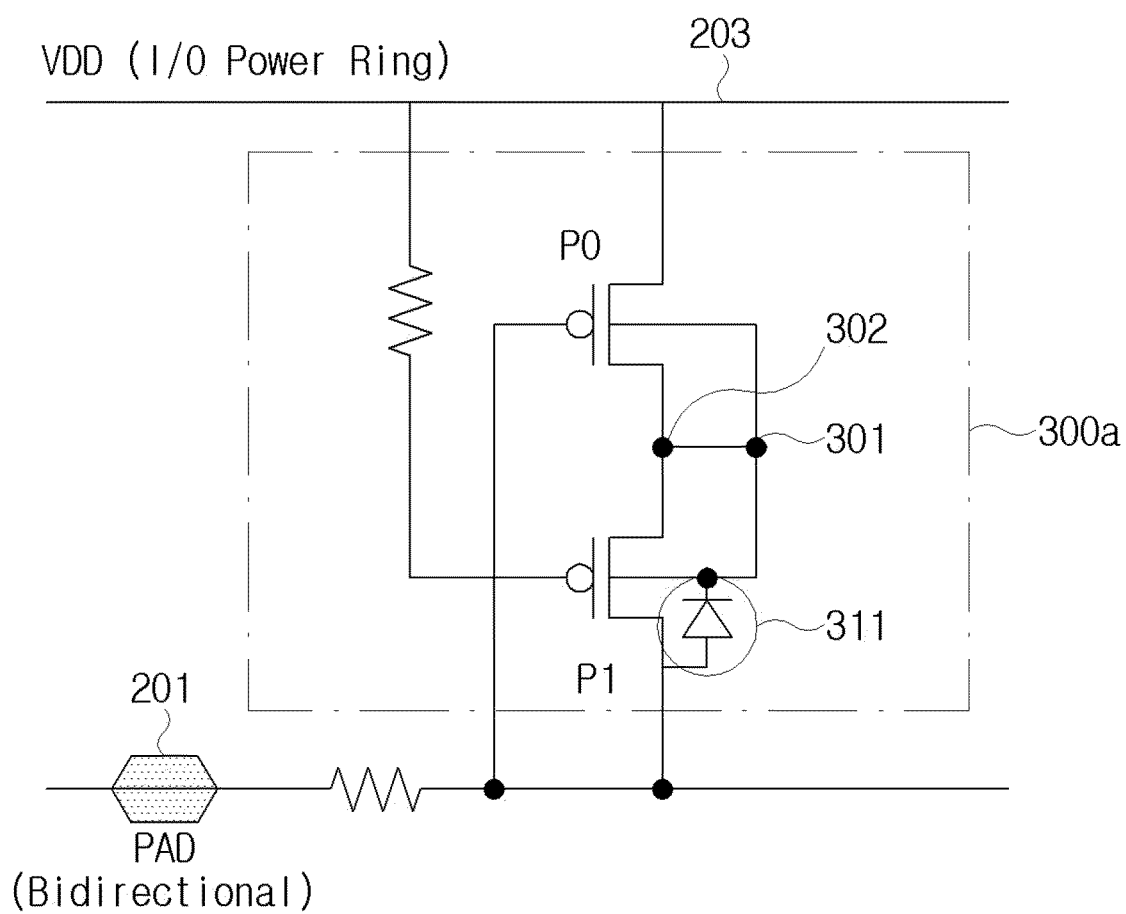
FIGS. 3A and 3B are diagrams respectively illustrating structures of floating N-well networks included in I/O circuits according to one or more embodiments of the present disclosure.
Figure 3B:
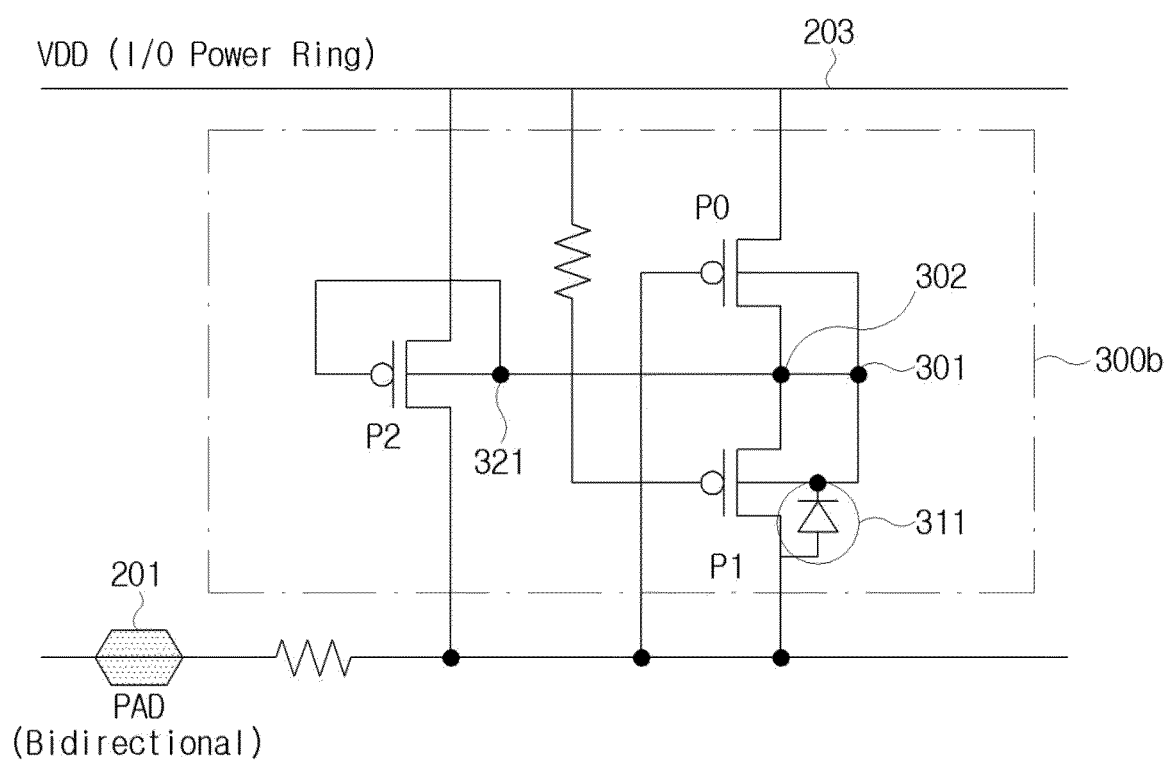

FIGS. 3A and 3B are diagrams respectively illustrating structures of floating N-well networks 300*a* and 300*b* included in I/O circuits according to one or more embodiments of the present disclosure.

Referring to FIG. 3A, a floating N-well network 300*a* may be provided at the input end of the I/O circuit 200. The floating N-well network 300*a* may include two PMOS transistors P0 and P1 each having a cascade structure.

The source of the first PMOS transistor P0 may be connected to VDD (or an I/O power ring) 203, and the drain of the first PMOS transistor P0 may be connected to the source of the second PMOS transistor P1. The gate of the first PMOS transistor P0 may be connected to the bidirectional pad 201. Also, the N-well of the first PMOS transistor P0 may be connected to the N-well of the second PMOS transistor P1. In this case, a node between the N-well of the first PMOS transistor P0 and the N-well of the second PMOS transistor P1 may be referred to as a floating N-well node 301. The floating N-well node 301 may be connected to a node 302 between the first PMOS transistor P0 and the second PMOS transistor P1.

The source of the second PMOS transistor P1 may be connected to the drain of the first PMOS transistor P0, and the drain of the second PMOS transistor P1 may be connected to the bidirectional pad 201. The gate of the second PMOS transistor P1 may be connected to the VDD 203. Also, the N-well of the second PMOS transistor P1 may be connected to the floating N-well node 301, and a parasitic diode 311 may be formed between the N-well and drain of the second PMOS transistor P1.

By configuring the floating N-well network 300*a* as described above, the floating N-well network 300*a* may be biased to the VDD level without affecting the processing of signals input through the bidirectional pad 201 while the chip B 120 is operating in a power down mode, and the chip A 110 is operating in a normal mode. For example, when the chip A 110 operates in normal mode and the chip B 120 operates in the power down mode, power is supplied through the VDD 203, so that the second PMOS transistor P1 is turned off.

When a low-level signal, e.g., a GND-level signal, is input through the bidirectional pad 201 from the chip A 110, which operates in the normal mode while the second PMOS transistor P1 is turned off, the first PMOS transistor P0 is turned on, so that the N-well node may be biased to the VDD level.

On the other hand, when a high-level signal, e.g., a VDD-level signal, is input through the bidirectional pad 201 from the chip A 110, which operates in the normal mode while the second PMOS transistor P1 is turned off, the N-well node may be biased to the VDD level via the parasitic diode 311 of the second PMOS transistor P1.

That is, the floating N-well network 300a provided at the input end of the I/O circuit 200 may bias the N-well node to the VDD level regardless of a signal input through the bidirectional pad 201 while the corresponding chip A 110 operates in the normal mode. In one or more embodiments of the present disclosure, as shown in FIG. 3A, a bias at the VDD level may be applied to the output post driver 210 (shown in FIG. 2) and/or the N-well node of a PMOS transistor included in an ESD protection device using the floating N-well network 300a.

According to one or more embodiments, the floating N-well network 300b may be configured as shown in FIG. 3B. The floating N-well network 300b shown in FIG. 3B is similar to that in FIG. 3A in that the floating N-well network 300b includes two PMOS transistors P0 and P1 having a cascade structure, but is different from that in FIG. 3A in that the floating N-well network 300b includes a third PMOS transistor P2. Since the connection structure between the first PMOS transistor P0 and the second PMOS transistor P1 is the same as that of FIG. 3A, a description thereof will be omitted.

The source of the third PMOS transistor P2 may be connected to the VDD 203 and the drain of the third PMOS transistor P2 may be connected to the bidirectional pad 201. The gate of the third PMOS transistor P2 may be connected to the N-well node 321 of the third PMOS transistor P2, and the N-well node 321 of the third PMOS transistor P2 may be connected to the floating N-well node 301.

By configuring the floating N-well network 300b shown in FIG. 3B as described above, the N-well node of the floating N-well network 300b may be biased to the VDD level without affecting the processing of signals input through the bidirectional pad 201 while the chip A 110 is operating in the normal mode.

Hereinafter, in one or more embodiments of the disclosure, an I/O circuit structure for blocking a leakage current using the floating N-well network as described above will be described.

Figure 4:
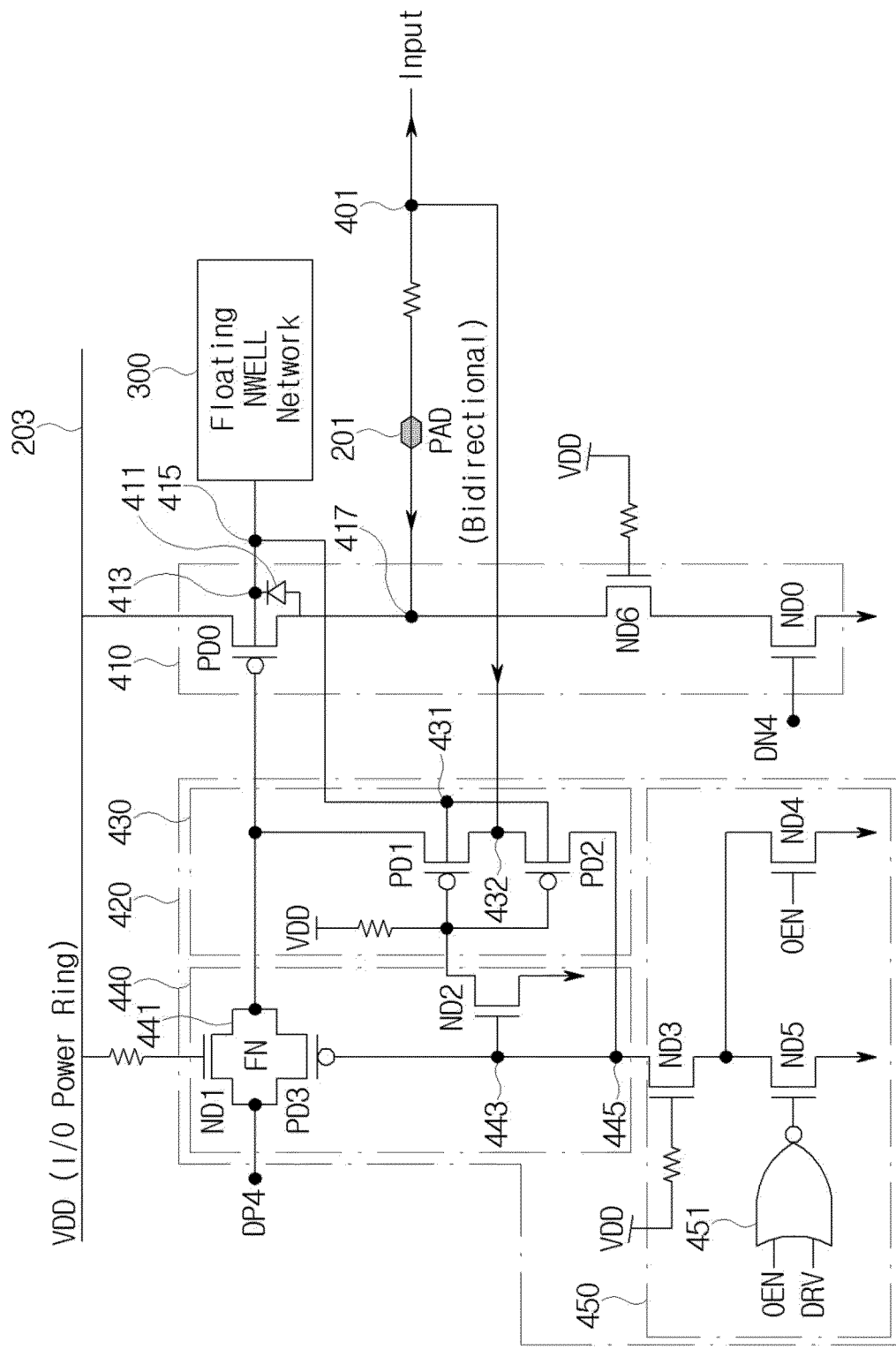
FIG. 4 is a diagram showing a structure of an I/O circuit for blocking a leakage current flowing through an output post driver according to one or more embodiments of the present disclosure.

FIG. 4 is a diagram showing a structure of an example of an I/O circuit for blocking a leakage current flowing through an output post driver according to one or more embodiments of the present disclosure.

Referring to FIG. 4, an output post driver 410 and a post driver control circuit 420 may be provided at the output end of the bidirectional I/O circuit 200.

According to one or more embodiments, the output post driver 410 may control a voltage amplitude and/or timing of a signal to be output through the bidirectional pad 201.

According to an embodiment, the output post driver 410 may include a first PMOS transistor PD0, a first NMOS transistor ND0, and a seventh NMOS transistor ND6.

The source of the first PMOS transistor PD0 may be connected to the VDD 203 and the drain of the first PMOS transistor PD0 may be connected to the bidirectional pad 201. The gate of the first PMOS transistor PD0 may be connected to a first control signal input terminal DP4 via transmission gates ND1 and PD3 included in the post driver control circuit 420. In this case, the first control signal input terminal DP4 may be an input terminal that provides a signal for controlling on/off of the first PMOS transistor PD0 during a normal mode. A parasitic diode 411 may be formed between the drain of the first PMOS transistor PD0 and the N-well node 413 of the first PMOS transistor PD0. Also, the N-well node 413 of the first PMOS transistor PD0 may be connected to the floating N-well network 300a or 300b without being connected to the source of the first PMOS transistor PD0 or the VDD 203. For example, the N-well node 413 of the first PMOS transistor PD0 may be connected to the floating N-well node 301 of the floating N-well network 300a or 300b configured as shown in FIG. 3A or 3B. In this case, by allowing the N-well node 413 of the first PMOS transistor PD0 not to be connected to the VDD 203, it is possible to prevent a leakage current flowing through the parasitic diode 411 from being transferred to the VDD 203 that is the power node even when a high-level signal, e.g., a VDD-level signal, is input from the bidirectional pad 201 during the power down mode. In addition, by connecting the N-well node 413 of the first PMOS transistor PD0 to the floating N-well network 300, it is possible to bias the N-well node 413 to the VDD level during the normal mode. In addition, even when a high-level signal, e.g., a VDD-level signal, is input through the bidirectional pad 201 during the power down mode, the N-well node 413 may be biased to the same VDD level as the high-level signal.

The source of the seventh NMOS transistor ND6 may be connected to the node 417 between the drain of the first PMOS transistor PD0 and the bidirectional pad 201, and the drain of the seventh NMOS transistor ND6 may be connected to the source of the first NMOS transistor ND0. The gate of the seventh NMOS transistor ND6 may be connected to the VDD 203. The seventh NMOS transistor ND6 may be turned off by a GND-level signal, that is, a low-level signal, which is input through the VDD 203 during the power down mode. That is, since the channel of the seventh NMOS transistor ND6 is not formed during the power down mode, it is possible to prevent a leakage current caused by the high-level signal, e.g., a VDD-level signal, input through the bidirectional pad 201 during the power-down mode from flowing to the ground (GND) connected to the first NMOS transistor ND0.

The drain of the first NMOS transistor ND0 may be connected to the source of the seventh NMOS transistor ND6, and the source of the first NMOS transistor ND0 may be connected to the ground GND. The gate of the first NMOS transistor ND0 may be connected to a second control signal input terminal DN4.

According to one or more embodiments, the post driver control circuit 420 may set a level of a signal input to the gate of the first PMOS transistor PD0 to a high level in order to prevent a leakage current path from being formed through the channel of the first PMOS transistor PD0 during the power down mode. The post driver control circuit 420 may block connection between the gate of the first PMOS transistor PD0 and the first control signal input terminal DP4 in order to prevent a leakage current path from being formed toward the first control signal input terminal DP4 when a high-level signal, e.g., a VDD-level signal, is input through the bidirectional input/output pad 201 during the power down mode.

The post driver control circuit 420 may control the output of the output post driver 410 during the normal mode. For example, the post driver control circuit 420 may control on/off of the gate of the first PMOS transistor PD0 in the output post driver 410 according to a first control signal DP4 during the normal mode.

According to one embodiment, the post driver control circuit 420 may include an input voltage setting unit 430, a leakage preventing unit 440, and an output control unit 450.

According to an embodiment, the input voltage setting unit 430 may set a level of an input signal applied to the gate of the first PMOS transistor PD0. Specifically, the input voltage setting unit 430 may set a level of an input signal applied to the gate of the first PMOS transistor 410 to a high level using the high-level signal, e.g., a VDD-level signal, input through the bidirectional pad 201 when the high-level signal is input through the bidirectional pad 201 while the chip is switched to power down mode. The reason to set the level of the input signal applied to the gate of the first PMOS transistor 410 to a high level may be to prevent a leakage current from flowing to the VDD 203 through the channel of the first PMOS transistor 410 due to a low-level signal, e.g., a GND-level signal, being applied to the gate of the first PMOS transistor 410 during the power down mode.

According to one embodiment, the input voltage setting unit 430 may include two PMOS transistors PD1 and PD2 having a floating N-well structure. The two PMOS transistors PD1 and PD2 having a floating N-well structure may include a second PMOS transistor PD1 and a third PMOS transistor PD2 having a series structure.

The source of the second PMOS transistor PD1 may be connected to the gate of the first PMOS transistor PD0, and the drain of the second PMOS transistor PD1 may be connected to the source of the third PMOS transistor PD2. The gate of the second PMOS transistor PD1 may be connected to the VDD 203. The N-well of the second PMOS transistor PD1 may be connected to the N-well of the third PMOS transistor PD2.

The source of the third PMOS transistor PD2 may be connected to the drain of the second PMOS transistor PD1, and the drain of the third PMOS transistor PD2 may be connected to the gate of the fourth PMOS transistor PD3 constituting the transmission gate 441 of the leakage preventing unit 440. The gate of the third PMOS transistor PD2 may be connected to the VDD 203. The N-well of the third PMOS transistor PD2 may be connected to the N-well of the second PMOS transistor PD1, and an N-well node 431 between the N-well of the third PMOS transistor PD2 and the N-well of the second PMOS transistor PD1 may be connected to a node 415 between the N-well node 413 of the first PMOS transistor PD0 and the floating N-well network 300.

A node 432 formed between the drain of the second PMOS transistor PD1 and the source of the third PMOS transistor PD2 may be connected to a node 401 formed on the input side of the bidirectional pad 201. The reason for this is to set a level of a signal input to the gate of the first PMOS transistor PD0 according to a level of a signal input through the bidirectional pad 201 during the power down mode.

Specifically, in the power down mode, the I/O power ring VDD 203 may be GND regardless of the level of the signal input through the bidirectional pad 201, so that a low-level signal is applied to both gates of the second PMOS transistor PD1 and the third PMOS transistor PD2. Through this, both the second PMOS transistor PD1 and the third PMOS transistor PD2 are turned on, and a high-level signal, e.g., a VDD-level signal, may be applied to the gate of the first PMOS transistor PD0 and the gate of the fourth PMOS transistor PD3, so that the first PMOS transistor PD0 and the fourth PMOS transistor PD3 may be turned off. In other words, in the power down mode, a leakage current input to the bidirectional pad 201 and received from an external chip in the normal mode may no longer affect the I/O circuit of the corresponding chip.

According to an embodiment, the leakage preventing unit 440 may prevent a leakage current path from being formed on the side of a control circuit connected to the first control signal input terminal DP4 due to an input signal applied to the gate of the first PMOS transistor PD0. Specifically, when it is set to apply a high-level signal, e.g., a VDD-level signal, to the gate of the first PMOS transistor PD0 during the power down mode, the leakage preventing unit 440 may prevent the high-level signal from being introduced into the first control signal input terminal DP4. The reason for this is to prevent a leakage current path from being formed through a PMOS parasitic diode included in the control circuit connected to the first control signal input terminal DP4.

According to one embodiment, the leakage preventing unit 440 may include a transmission gate 441 and a third NMOS transistor ND2.

The transmission gate 441 may include a second NMOS transistor ND1 and a fourth PMOS transistor PD3 connected in parallel between the first control signal input terminal DP4 and the gate of the first PMOS transistor PD0. The gate of the second NMOS transistor ND1 may be connected to the VDD 203, and the gate of the fourth PMOS transistor PD3 may be connected to the drain of the third PMOS transistor PD2. In this case, the reason why the gate of the fourth PMOS transistor PD3 is connected to the drain of the third PMOS transistor PD2 is to prevent a high-level signal, e.g., a VDD-level signal, from being transferred to the first control signal input terminal DP4 when a signal input to the gate of the first PMOS transistor PD0 is a high-level signal during the power down mode. That is, when a high-level signal is input through the bidirectional pad 201 during the power down mode, the gate of the fourth PMOS transistor PD3 may receive the high-level signal from the drain of the third PMOS transistor PD2. When a high-level signal, e.g., a VDD-level signal, is applied to the gate of the fourth PMOS transistor PD3, the fourth PMOS transistor PD3 is turned off to form no channel. Also, since the gate of the second NMOS transistor ND1 is connected to the VDD 203, the second NMOS transistor ND1 may be maintained in a turned-off state in which no channel is formed during the power down mode. Therefore, when a high-level signal, e.g., a VDD-level signal, is input through the bidirectional pad 201 during the power down mode, the transmission gate 441 may prevent the high-level signal input to the gate of the first PMOS transistor PD0 from being transferred to the first control signal input terminal DP4.

Also, the N-well of the fourth PMOS transistor PD3 may be connected to the floating N-well network 300a or 300b (FN). The reason for this is to prevent a leakage current path from being formed through a parasitic diode formed between the drain and the N-well of the fourth PMOMS transistor PD3.

The transmission gate 441 may transfer a signal input from the first control signal input terminal DP4 to the first PMOS transistor PD0 during the normal mode. For example, since both the second PMOS transistor PD1 and the third PMOS transistor PD2 connected to the VDD are turned off in the normal mode, the leakage preventing unit 440 may transfer a signal input from the first control signal input terminal DP4 through the transmission gate 441 to the first PMOS transistor PD0.

The drain of the third NMOS transistor ND2 may be connected to the VDD 203 and the source of the third NMOS transistor ND2 may be connected to ground. The gate of the third NMOS transistor ND2 may be connected to a node 443 formed between the gate of the fourth PMOS transistor PD3 and the third PMOS transistor PD2. The reason for this is to ensure that a VDD-level signal has a ground level within a short period of time during the power down mode. That is, when a signal input through the bidirectional pad 201 changes from a low level to a high level during the power down mode, a voltage and/or current signal may be introduced into the VDD 203 due to coupling of PMOS parasitic capacitance of the floating N-well network 300. As a result, the second NMOS transistor ND1 is turned on, and current may be introduced into the VDD 203 through the PMOS parasitic diode on the side of the first control signal input terminal DP4. Accordingly, the third NMOS transistor ND2 is turned on during the power down mode to introduce the voltage and/or current signal flowing into the VDD 203 into the ground GND, thereby enabling other components to be bypassed. This allows the leakage current provided to the second NMOS transistor (ND1) to be blocked.

According to one embodiment, the output control unit 450 may control the output of the output post driver 410 during the normal mode. Specifically, the output control unit 450 may turn on the transmission gate 441 of the post driver control circuit 420 when the bidirectional I/O circuit 200 operates in an output mode during the normal mode. Additionally, the output control unit 450 may turn off the output post driver 410 when the bidirectional I/O circuit 200 is operating in an input mode during the normal mode.

According to one embodiment, the output control unit 450 may prevent high-level signals, e.g., VDD-level signals, input through bidirectional pad 201 from flowing to the ground side during power down mode.

According to one embodiment, the output control unit 450 may include a fourth NMOS transistor ND3, a fifth NMOS transistor ND4, a sixth NMOS transistor ND5, and a NOR gate 451.

The drain of the fourth NMOS transistor ND3 may be connected to a node 445 formed between the third PMOS transistor PD2 and the fourth PMOS transistor PD3, and the source of the fourth NMOS transistor ND3 may be connected to the drain of the fifth NMOS transistor ND4. The gate of the fourth NMOS transistor ND3 may be connected to the VDD 203. The fourth NMOS transistor ND3 may be turned off by a GND-level signal, that is, a low-level signal, which is input through the VDD 203 during the power down mode. That is, since the channel of the fourth NMOS transistor ND3 is not formed during the power down mode, it is possible to prevent a leakage current caused by the high-level signal, e.g., a VDD-level signal, input through the bidirectional pad 201 during the power-down mode from flowing to the ground (GND) connected to the fifth NMOS transistor ND4.

The drain of the fifth NMOS transistor ND4 may be connected to the source of the fourth NMOS transistor ND3, and the source of the fifth NMOS transistor ND4 may be connected to the ground. An output enable negative (OEN) signal may be input to the gate of the fifth NMOS transistor ND4. For example, when the bidirectional I/O circuit 200 operates in the output mode, a low-level output enable negative (OEN) signal may be input to the gate of the fifth NMOS transistor ND4. When the bidirectional I/O circuit 200 operates in the input mode, a high-level output enable negative (OEN) signal may be input to the gate of the fifth NMOS transistor ND4.

The NOR gate 451 may perform a NOR operation on the output enable negative (OEN) signal and a drive (DRV) signal, and output a result of the operation. The drive signal may be a signal for selecting a drive current of the output post driver 410.

The drain of the sixth NMOS transistor ND5 may be connected to a node 453 between the source of the fourth NMOS transistor ND3 and the drain of the fifth NMOS transistor ND4, and the source of the sixth NMOS transistor ND5 may be connected to the ground. The gate of the sixth NMOS transistor ND5 may be connected to an output terminal of the NOR gate 451. Accordingly, the sixth NMOS transistor ND5 may be turned on/off by the output signal of the NOR gate 451, thereby performing control such that the first PMOS transistor PD0 of the output post driver 410 is turned on/off.

Figure 5:
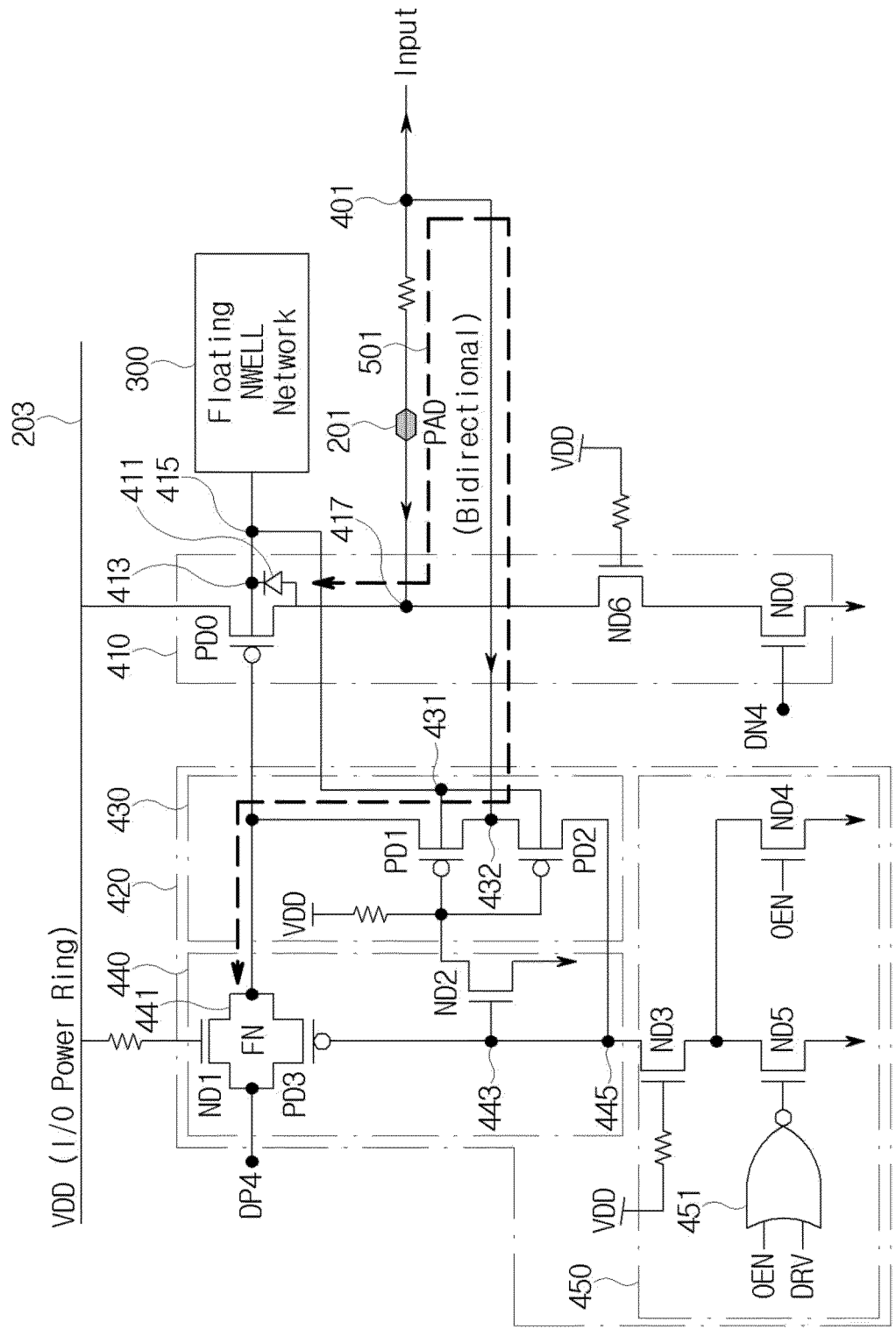
FIG. 5 is a diagram showing a flow of a leakage current which is blocked in an I/O circuit according to one or more embodiments of the present disclosure.

In one or more embodiments of the present disclosure, as shown in FIG. 4, the first PMOS transistor PD0 is designed such that the source and N-well node of the first PMOS transistor PD0 included in the output post driver 410 are not physically connected to each other, thereby preventing a leakage current 501, shown in FIG. 5, caused by the high-level signal, e.g., a VDD-level signal, input through the bidirectional pad 201 during the power down mode from being introduced into the VDD 203 through the parasitic diode 411 of the first PMOS transistor PD0. In addition, by setting a level of a signal input to the gate of the first PMOS transistor PD0 through the input voltage setting unit 430 of the post driver control circuit 420 to a high level, the leakage current 501 caused by the high-level signal, e.g., a VDD-level signal, is prevented from being introduced into the VDD 203 through the channel of the first PMOS transistor PD0. In addition, by blocking the connection between the gate of the first PMOS transistor PD0 and the first control signal input terminal DP4 through the leakage preventing unit 440 of the post driver control circuit 420, the leakage current 501 due to the high-level signal 501 is prevented from being introduced into the first control signal input terminal DP4.

In the above description, the circuit structure for blocking the leakage current path through the output post driver 410 provided at the output end of the bidirectional I/O circuit 200 has been described. However, according to one or more embodiments, as shown in FIG. 6, it may be possible to block a leakage current path formed through the ESD protection device 610.

Figure 6:
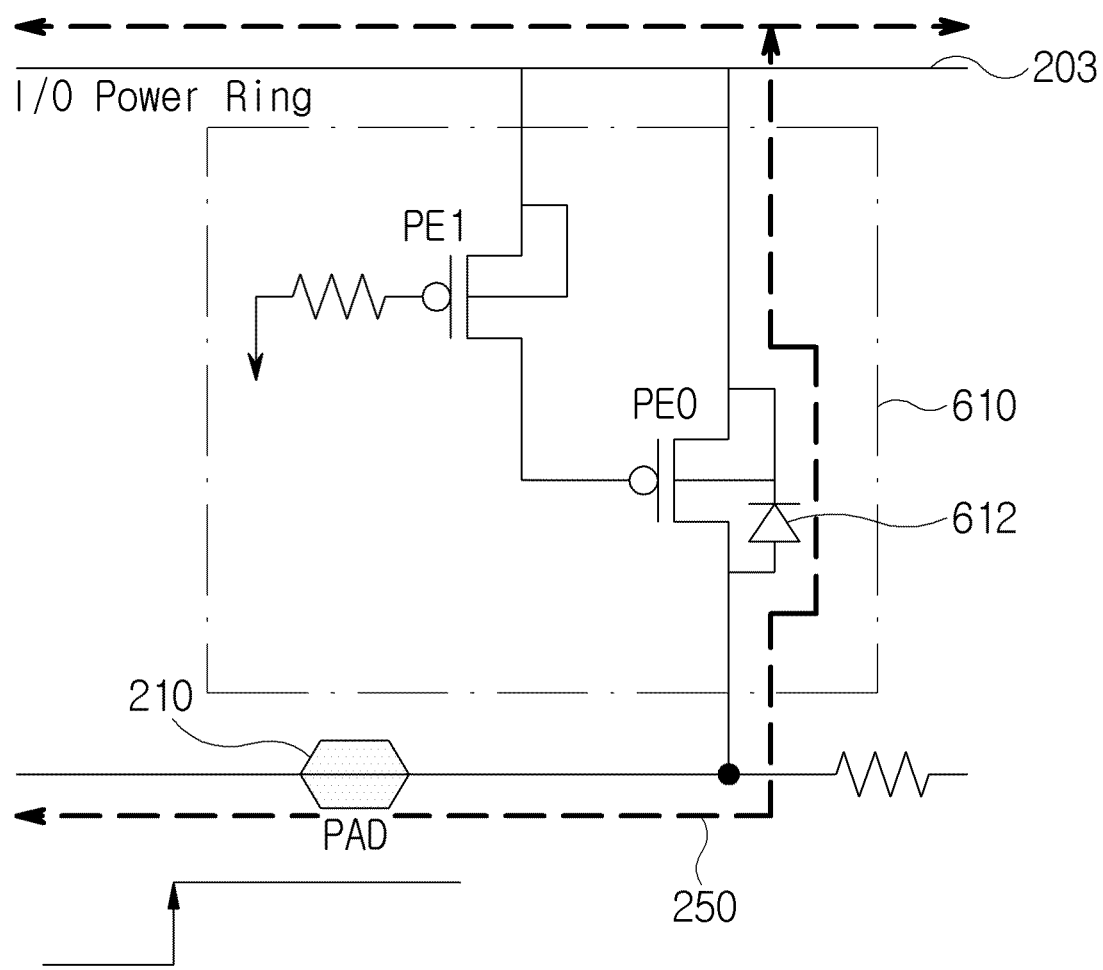
FIG. 6 is a diagram showing an example of a path of a leakage current flowing through an ESD protection device included in an I/O circuit according to one or more embodiments of the present disclosure.

FIG. 6 is a diagram showing an example of a path of a leakage current flowing through an ESD protection device included in an I/O circuit according to one or more embodiments of the present disclosure.

Referring to FIG. 6, an ESD protection device 610 may be provided at the input end of the bidirectional I/O circuit 200 to protect the bidirectional I/O circuit 200. A parasitic diode 612 may be formed between the N-well node and drain of the first PMOS transistor PEO included in the ESD protection device 610. Therefore, when a high-level signal, e.g., a VDD-level signal, is input through the bidirectional pad 201 during a power-down mode, a leakage current path 250 running from the bidirectional pad 201 to the I/O power ring 203 through the parasitic diode 612 of the first PMOS transistor PE0 may be formed.

Figure 7A:
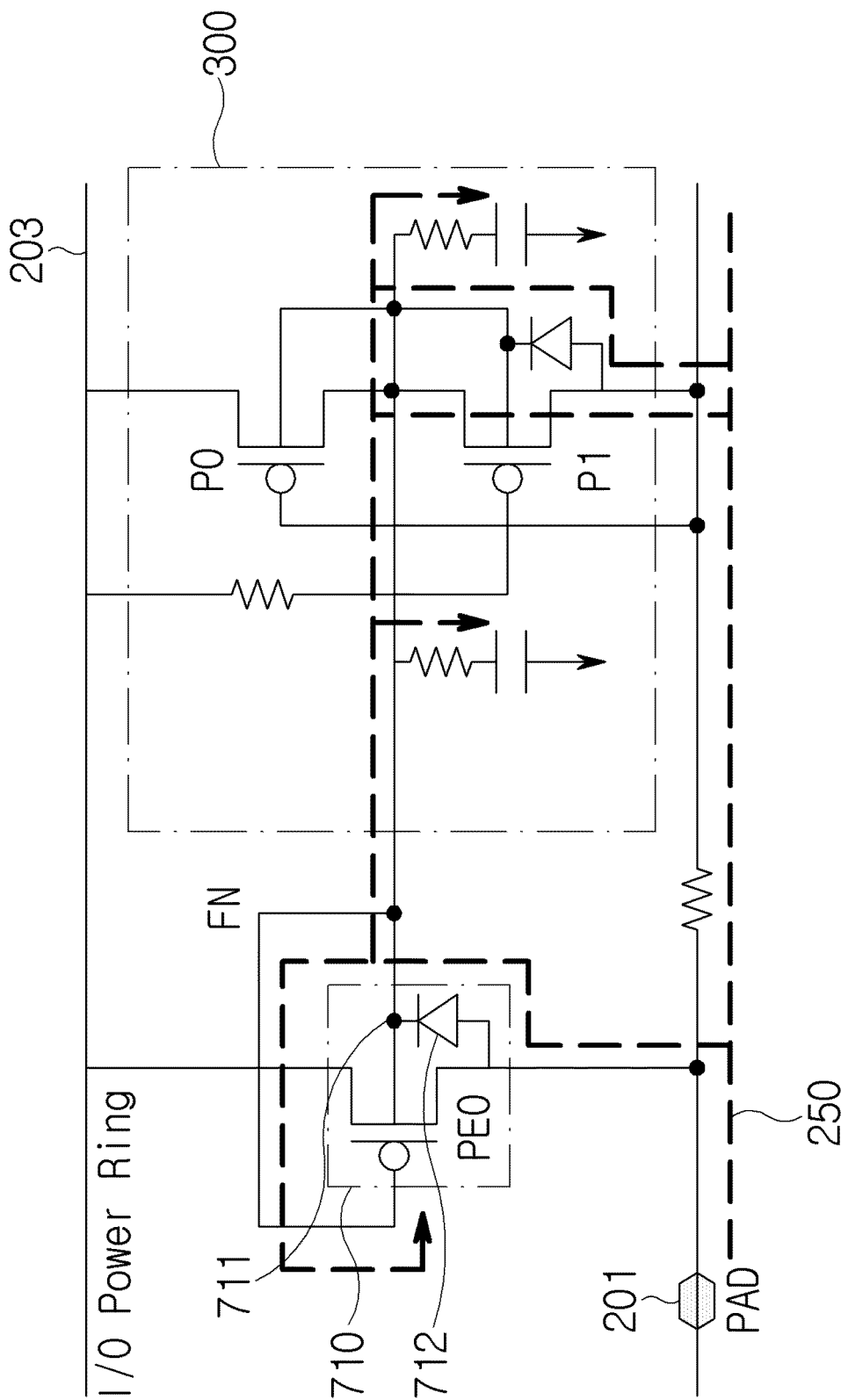
FIGS. 7A and 7B are diagrams showing a structure of an I/O circuit for blocking a leakage current flowing through an ESD protection device according to one or more embodiments of the present disclosure.
Figure 7B:
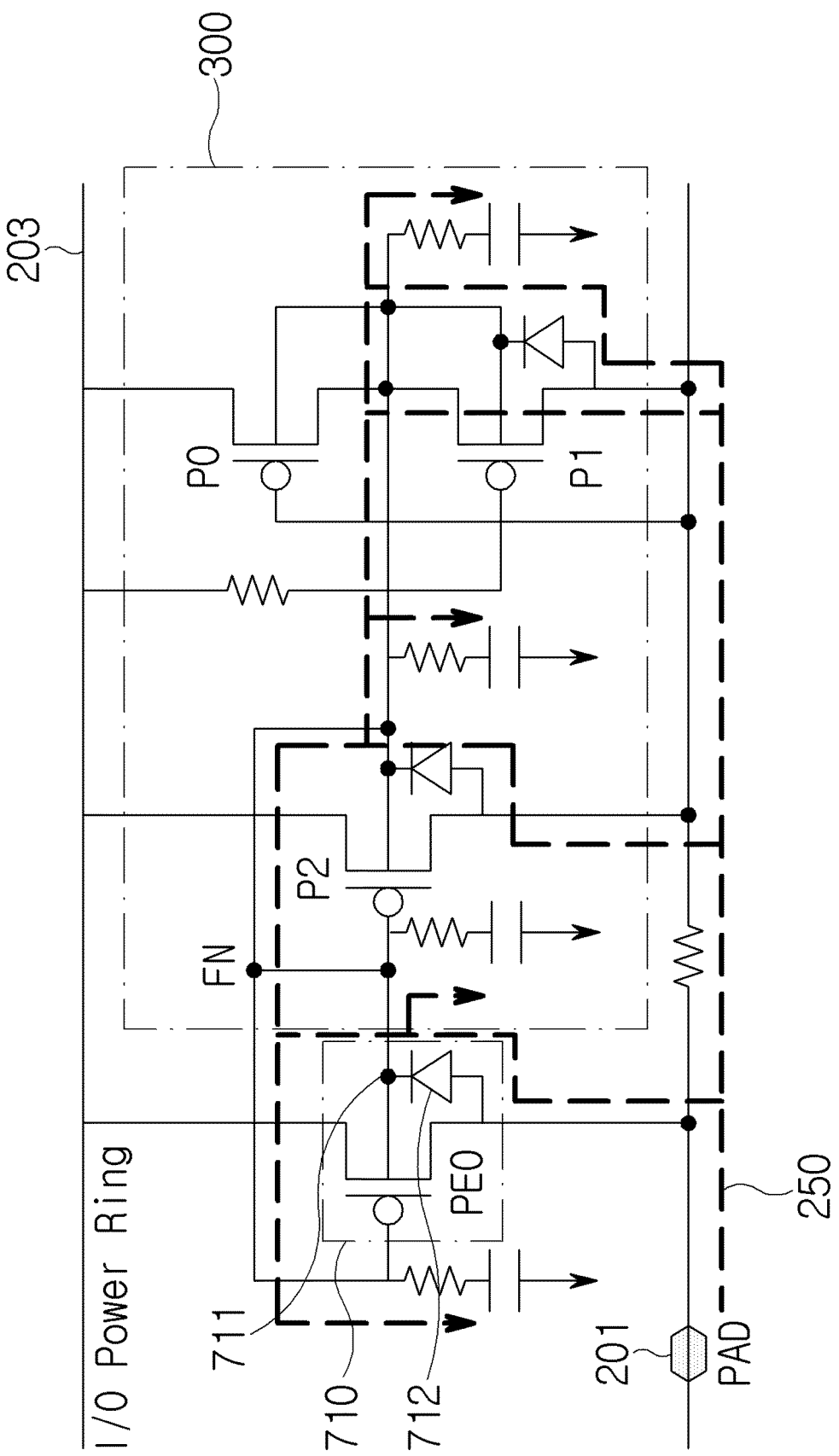

Therefore, according to one or more embodiments of the present disclosure, the method of blocking the leakage current path in the output post driver 410 may be applied to the ESD protection device 610 in the same manner. For example, as shown in FIGS. 7A and 7B, it is possible to block the leakage current path running from the ESD protection device 710 to the I/O power ring 203 by physically cutting the connection between the N-well node 711 of the first PMOS transistor PE0 included in the ESD protection device 710 and the I/O power ring 203, and connecting the N-well node 711 to the floating N-well network 300a or 300b. FIGS. 7a and 7b show the same structure except that the floating N-well networks 300 are different. That is, the floating N-well network 300a of FIG. 3A is applied to FIG. 7A, and the floating N-well network 300b of FIG. 3B is applied to FIG. 7B.

When the floating N-well network 300 and/or the post driver control circuit 420 as suggested in the present disclosure are not used, an average leakage current of about 131 nA may be caused. When the leakage current path is blocked using the floating N-well network 300 and/or the post driver control circuit 420 as suggested in the present disclosure, the average leakage current may be reduced to about 6 nA.

Accordingly, various embodiments of the disclosure disclose a bidirectional I/O circuit that blocks a leakage current path and an integrated circuit including the same.

The bidirectional I/O circuit according to one or more embodiments of the present disclosure blocks a leakage current path during a power down mode using a floating N-well network and a control circuit, thereby preventing unnecessary power consumption in the control logics of a core logic circuit and the I/O circuit in an integrated circuit.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A bidirectional I/O circuit comprising:
a bidirectional pad configured to receive and transmit signals;
an output post driver configured to control an output signal of the bidirectional pad during a normal mode;
a floating N-well network configured to apply a VDD-level bias to the output post driver based on an input signal of the bidirectional pad during a power down mode;
a post driver control circuit configured to set an input voltage level of the output post driver to a VDD level during the power down mode to prevent a leakage current path from being formed through the output post driver; and
an ESD protection circuit disposed on an input side of the bidirectional pad to protect a component included in the bidirectional I/O circuit,
wherein the output post driver comprises a first PMOS transistor having a source connected to VDD, a drain connected to the bidirectional pad, and a gate connected to the post driver control circuit,
wherein a parasitic diode is formed between the drain of the first PMOS transistor and an N-well of the first PMOS transistor,
wherein an N-well node of the first PMOS transistor is connected to the floating N-well network without being connected to the source of the first PMOS transistor,
wherein the ESD protection circuit comprises a PMOS transistor having a source connected to the VDD, a drain connected to the input side of the bidirectional pad, and a gate connected to the floating N-well network,
wherein a parasitic diode is formed between the drain of the PMOS transistor and an N-well node of the PMOS transistor, and
wherein the N-well node of the PMOS transistor is connected to the floating N-well network without being connected to the source of the PMOS transistor.

2. The bidirectional I/O circuit of claim 1, wherein the post driver control circuit comprises either one or both of:
an input voltage setting unit configured to set an input voltage level of the first PMOS transistor to the VDD level based on a VDD-level signal input through the bidirectional pad during the power down mode; and
a leakage preventing unit configured to block connections between the gate of the first PMOS transistor and a first control signal input terminal during the power down mode, and
wherein the first control signal input terminal is configured to provide a signal for controlling the first PMOS transistor on/off during the normal mode.

3. The bidirectional I/O circuit of claim 2, wherein the input voltage setting unit comprises a second PMOS transistor and a third PMOS transistor each having a floating N-well structure,
wherein a source of the second PMOS transistor is connected to the gate of the first PMOS transistor, a drain of the second PMOS transistor is connected to a source of the third PMOS transistor, a gate of the second PMOS transistor is connected to the VDD, and an N-well of the second PMOS transistor is connected to the floating N-well network,
wherein a drain of the third PMOS transistor is connected to the leakage preventing unit, a gate of the third PMOS transistor is connected to the VDD, and an N-well of the third PMOS transistor is connected to the floating N-well network, and
wherein a node between the drain of the second PMOS transistor and the source of the third PMOS transistor is connected to an input side of the bidirectional pad.

4. The bidirectional I/O circuit of claim 3, wherein the leakage preventing unit comprises a transmission gate connecting the first control signal input terminal and the gate of the first PMOS transistor,
wherein the transmission gate comprises a second NMOS transistor and a fourth PMOS transistor connected in parallel, and wherein a gate of the second NMOS transistor is connected to the VDD, and a gate of the fourth PMOS transistor is connected to the drain of the third PMOS transistor.

5. The bidirectional I/O circuit of claim 4, wherein an N-well of the fourth PMOS transistor is connected to the floating N-well network.

6. The bidirectional I/O circuit of claim 4, wherein the leakage preventing unit further comprises a third NMOS transistor configured to sink current flowing into the VDD to the ground during the power down mode, and
wherein a drain of the third NMOS transistor is connected to the VDD, a source of the third NMOS transistor is connected to the ground, and a gate of the third NMOS transistor is connected to a node between the gate of the fourth PMOS transistor and the drain of the third PMOS transistor.

7. The bidirectional I/O circuit of claim 3, wherein the post driver control circuit further comprises an output control unit configured to control an output of the output post driver according to an input/output mode during the normal mode and adjust timing of current flowing through the output post driver during the normal mode.

8. The bidirectional I/O circuit of claim 7, wherein the output control unit comprises a fourth NMOS transistor and a fifth NMOS transistor,
wherein a drain of the fourth NMOS transistor is connected to a node between the gate of the fourth PMOS transistor and the drain of the third PMOS transistor, a source of the fourth NMOS transistor is connected to a drain of the fifth NMOS transistor, and a gate of the fourth NMOS transistor is connected to the VDD,
wherein a source of the fifth NMOS transistor is connected to the ground, and a gate of the fifth NMOS transistor is configured to receive an output enable negative (OEN) signal enabling an output mode, and
wherein the fourth NMOS transistor is configured to prevent a signal input through the bidirectional pad from flowing to the ground of the fifth NMOS transistor during the power-down mode.

9. The bidirectional I/O circuit of claim 8, wherein the output control unit further comprises a NOR gate and a sixth NMOS transistor,
wherein the NOR gate is configured to perform a NOR operation on the output enable negative (OEN) signal and a drive (DRV) signal for selecting a drive current, and
wherein a drain of the sixth NMOS transistor is connected to a node between the fourth NMOS transistor and the fifth NMOS transistor, a source of the sixth NMOS transistor is connected to the ground, and a gate of the sixth NMOS transistor is configured to receive a result of the NOR operation of the NOR gate.

10. The bidirectional I/O circuit of claim 1, wherein the output post driver further comprises a first NMOS transistor and a seventh NMOS transistor,
wherein a drain of the first NMOS transistor is connected to a source of the seventh NMOS transistor, a source of the first NMOS transistor is connected to the ground, and a gate of the first NMOS transistor is connected to a second control signal input terminal,
wherein a drain of the seventh NMOS transistor is connected to a node between the first PMOS transistor and the bidirectional pad, a source of the seventh NMOS transistor is connected to the drain of the first NMOS transistor, and a gate of the seventh NMOS transistor is connected to the VDD, and wherein the seventh NMOS transistor is configured to prevent a signal input through the bidirectional pad from flowing to the ground of the first NMOS transistor during the power-down mode.

11. The bidirectional I/O circuit of claim 1, wherein the floating N-well network comprises two PMOS transistors serially disposed on an input side of the bidirectional pad,
wherein a first PMOS transistor of the two PMOS transistors comprises a source connected to the VDD, a drain connected to a source of a second PMOS transistor of the two PMOS transistors, and a gate connected to the input side of the bidirectional pad,
wherein the second PMOS transistor comprises the source connected to the drain of the first PMOS transistor, a drain connected to the input side of the bidirectional pad, and a gate connected to the VDD,
wherein a parasitic diode is formed between the drain of the second PMOS transistor and an N-well of the second PMOS transistor, and
wherein an N-well of the first PMOS transistor and the N-well of the second PMOS transistor are connected to each other, and a node between the N-well of the first PMOS transistor and the N-well of the second PMOS transistor is connected to a node between the drain of the first PMOS transistor and the source of the second PMOS transistor to form a floating N-well node regardless of signal input to the bidirectional pad during the power down mode.

12. An integrated circuit, comprising:
a core logic circuit; and
the bidirectional I/O circuit of claim 1 connected to the core logic circuit.

13. An integrated circuit, comprising:
a core logic circuit; and
a bidirectional I/O circuit connected to the core logic circuit,
wherein the bidirectional I/O circuit comprises:
a bidirectional pad configured to receive and transmit signals;
an output post driver configured to control an output signal of the bidirectional pad during a normal mode;
a floating N-well network configured to apply a VDD-level bias to the output post driver based on an input signal of the bidirectional pad during a power down mode;
a post driver control circuit configured to set an input voltage level of the output post driver to a VDD level during the power down mode to prevent a leakage current path from being formed through the output post driver; and
an ESD protection circuit disposed on an input side of the bidirectional pad to protect a component included in the bidirectional I/O circuit,
wherein the output post driver comprises a first PMOS transistor having a source connected to VDD, a drain connected to the bidirectional pad, and a gate connected to the post driver control circuit,
wherein a parasitic diode is formed between the drain of the first PMOS transistor and an N-well of the first PMOS transistor, and
wherein an N-well node of the first PMOS transistor is connected to the floating N-well network without being connected to the source of the first PMOS transistor,
wherein the ESD protection circuit comprises a PMOS transistor having a source connected to the VDD, a drain connected to the input side of the bidirectional pad, and a gate connected to the floating N-well network, wherein a parasitic diode is formed between the drain of the PMOS transistor and an N-well node of the PMOS transistor, and wherein the N-well node of the PMOS transistor is connected to the floating N-well network without being connected to the source of the PMOS transistor.

14. The integrated circuit of claim 13, wherein the post driver control circuit comprises either one or both of:

an input voltage setting unit configured to set an input voltage level of the first PMOS transistor to the VDD level based on a VDD-level signal input through the bidirectional pad during the power down mode; and a leakage preventing unit configured to block connections between the gate of the first PMOS transistor and a first control signal input terminal during the power down mode, and wherein the first control signal input terminal is configured to provide a signal for controlling the first PMOS transistor on/off during the normal mode.

15. The integrated circuit of claim 14, wherein the input voltage setting unit comprises a second PMOS transistor and a third PMOS transistor each having a floating N-well structure, wherein a source of the second PMOS transistor is connected to the gate of the first PMOS transistor, a drain of the second PMOS transistor is connected to the source of the third PMOS transistor, a gate of the second PMOS transistor is connected to the VDD, and an N-well of the second PMOS transistor is connected to the floating N-well network, wherein a source of the third PMOS transistor is connected to the drain of the second PMOS transistor, a drain of the third PMOS transistor is connected to the leakage preventing unit, a gate of the third PMOS transistor is connected to the VDD, and an N-well of the third PMOS transistor is connected to the floating N-well network, and wherein a node between the drain of the second PMOS transistor and the source of the third PMOS transistor is connected to an input side of the bidirectional pad.

16. The integrated circuit of claim 15, wherein the leakage preventing unit comprises a transmission gate connecting the first control signal input terminal and the gate of the first PMOS transistor, wherein the transmission gate comprises a second NMOS transistor and a fourth PMOS transistor connected in parallel, and wherein a gate of the second NMOS transistor is connected to the VDD, and a gate of the fourth PMOS transistor is connected to the drain of the third PMOS transistor.

17. The integrated circuit of claim 16, wherein an N-well of the fourth PMOS transistor is connected to the floating N-well network.

18. The integrated circuit of claim 16, wherein the leakage preventing unit further comprises a third NMOS transistor configured to sink current flowing into the VDD to the ground during the power down mode, and wherein a drain of the third NMOS transistor is connected to the VDD, a source of the third NMOS transistor is connected to the ground, and a gate of the third NMOS transistor is connected to a node between the gate of the fourth PMOS transistor and the drain of the third PMOS transistor.

19. The integrated circuit of claim 15, wherein the post driver control circuit comprises an output control unit configured to control an output of the output post driver according to an input/output mode during the normal mode and adjust timing of current flowing through the output post driver during the normal mode.

20. The integrated circuit of claim 19, wherein the output control unit comprises a fourth NMOS transistor and a fifth NMOS transistor, wherein a drain of the fourth NMOS transistor is connected to a node between the gate of the fourth PMOS transistor and the drain of the third PMOS transistor, a source of the fourth NMOS transistor is connected to the drain of a fifth NMOS transistor, and a gate of the fourth NMOS transistor is connected to the VDD, wherein a source of the fifth NMOS transistor is connected to the ground, and a gate the fifth NMOS transistor is configured to receive an output enable negative (OEN) signal enabling an output mode, and wherein the fourth NMOS transistor is configured to prevent a signal input through the bidirectional pad from flowing to the ground of the fifth NMOS transistor during the power-down mode.

21. The integrated circuit of claim 20, wherein the output control unit further comprises a NOR gate and a sixth NMOS transistor, wherein the NOR gate is configured to perform a NOR operation on the output enable negative (OEN) signal and a drive (DRV) signal for selecting a drive current, and wherein a drain of the sixth NMOS transistor is connected to a node between the fourth NMOS transistor and the fifth NMOS transistor, a source of the sixth NMOS transistor is connected to the ground, and a gate of the sixth NMOS transistor is configured to receive a result of the NOR operation of the NOR gate.

22. The integrated circuit of claim 13, wherein the output post driver further comprises a first NMOS transistor and a seventh NMOS transistor, wherein a drain of the first NMOS transistor is connected to a source of the seventh NMOS transistor, a source of the first NMOS transistor is connected to the ground, and a gate of the first NMOS transistor is connected to a second control signal input terminal, wherein a drain of the seventh NMOS transistor is connected to a node between the first PMOS transistor and the bidirectional pad, a source of the seventh NMOS transistor is connected to the drain of the first NMOS transistor, and a gate of the seventh NMOS transistor is connected to the VDD, and wherein the seventh NMOS transistor is configured to prevent a signal input through the bidirectional pad from flowing to the ground of the first NMOS transistor during the power-down mode.

23. The integrated circuit of claim 13, wherein the floating N-well network comprises two PMOS transistors serially disposed on an input side of the bidirectional pad, wherein a first PMOS transistor of the two PMOS transistors comprises a source connected to the VDD, a drain connected to a source of a second PMOS transistor of the two PMOS transistors, and a gate connected to the input side of the bidirectional pad, wherein the second PMOS transistor comprises the source connected to the drain of the first PMOS transistor, a drain connected to the input side of the bidirectional pad, and a gate connected to the VDD, wherein a parasitic diode is formed between the drain of the second PMOS transistor and an N-well of the second PMOS transistor, and wherein an N-well of the first PMOS transistor and the N-well of the second PMOS transistor are connected to each other, and a node between the N-well of the first PMOS transistor and the N-well of the second PMOS transistor is connected to a node between the drain of the first PMOS transistor and the source of the second PMOS transistor to form a floating N-well node regardless of signal input to the bidirectional pad during the power down mode.

\* \* \* \* \*